United States Patent [19]

Wintz et al.

[11] 3,905,028

[45] Sept. 9, 1975

[54] DIRECT DIGITAL LOGARITHMIC ENCODER

[75] Inventors: Paul A. Wintz, Lafayette, Ind.; John R. Sergo, Jr., Delaware; Ching-Long Song, Columbus, both of Ohio

[73] Assignee: North Electric Company, Galion, Ohio

[22] Filed: Aug. 2, 1973

[21] Appl. No.: 385,095

[52] U.S. Cl. ........................ 340/347 AD; 179/15 AV

[51] Int. Cl.$^2$ ........................................ H03K 13/02

[58] Field of Search ......... 340/347 AD; 179/15 AV; 325/38 B

[56] References Cited

UNITED STATES PATENTS

| | | | |
|---|---|---|---|
| 2,836,356 | 5/1958 | Forrest et al. | 340/347 DA |
| 2,865,564 | 12/1958 | Kaiser et al. | 340/347 AD X |
| 2,989,741 | 6/1961 | Gordon et al. | 340/347 DA |
| 3,015,815 | 1/1962 | Mann | 340/347 AD |
| 3,016,528 | 1/1962 | Villars | 340/347 AD |
| 3,349,390 | 10/1967 | Glassman | 340/347 NT |
| 3,500,247 | 3/1970 | Sekimoto et al. | 325/38 R X |
| 3,662,163 | 5/1972 | Miller et al. | 340/347 AD |
| 3,688,221 | 8/1972 | Fruhalf | 340/347 AD UX |
| 3,699,566 | 10/1972 | Schindler | 340/347 AD |

OTHER PUBLICATIONS

Hoeschele, "Analog-to-Digital," Wiley & Sons, 8/1968, pp. 9 & 10.

*Primary Examiner*—Thomas J. Sloyan
*Attorney, Agent, or Firm*—Johnson, Dienner, Emrich & Wagner

[57] ABSTRACT

An analog-to-digital converter is disclosed which directly converts analog signals, such as voice, into digital signals exhibiting logarithmic compression characteristics. The apparatus is digitally controlled, performs encoding at minimal operating speed and may be utilized on a per line basis.

21 Claims, 2 Drawing Figures

DIRECT DIGITAL LOGARITHMIC ENCODER

BACKGROUND OF THE INVENTION

1. Field of the Invention

In general, this invention relates to digital information processing systems. More particularly, this invention relates to analog-to-digital encoding (conversion) apparatus and methods used for encoding analog signals, such as voice, into a sequence of binary code words which exhibits a logarithmic characteristic.

2. Description of the Prior Art

In PCM (pulse code modulation) communication systems, continuous time varying information signals, such as electrical speech signals, may be represented by a series of ON and OFF pulses. In this process, the signal is periodically sampled, quantized, and encoded into binary code words indicative of the amplitude of the input signal. In the quantizing process, the exact level of the time varying input signal at the instant the sample is taken is approximated by one of a number of discrete values called quantum levels. The difference between the instantaneous value of the input signal and the quantum level actually transmitted is called quantizing error and gives rise to what is known variously as quantizing noise or quantizing distortion.

Quantizing distortion is especially objectionable and very often intolerable when the instantaneous value or magnitude of the input signal is small, but is usually of little or no significance when the instantaneous magnitude of the input signal is high. For higher quality and more effective transmission, it is therefore desirable to have more quantum levels of smaller increment for the lower amplitudes of the input signal and relatively fewer quantum levels of greater increment for the higher amplitudes of the input signal. This non-linear redistribution of the total number of levels available is called "companding," a verbal contaction of the terms "compression" and "expanding," Companding, therefore, balances the undesirable effects of quantizing error by reducing the magnitude of the quantizing error for low amplitude input signals where quantizing distortion would be a serious matter at the price of increased quantizing error for higher amplitude signals where increased distortion can be tolerated. Restated, the purpose of the PCM compander is to reallocate the quantizing impairment of the original signal by quantizing on a non-uniform or non-linear, rather than a uniform or linear, basis.

Sequential companding on a non-linear basis may be obtained by the level elimination process where the number of quantization levels decreases either linearly or exponentially with increasing input signal amplitude. The linear level elimination process provides a satisfactory companding characteristic for higher level input signals but is just barely adequate for lower level signals. Although the companding characteristic for lower level signals could be readily improved to meet modern transmission system requirements with logic circuitry having higher speeds utilizing many quantum levels closer together, the required logic speed is not obtainable at the present state of the art. The logic speeds required are readily appreciated once it is remembered that these networks normally take the input signals and encode it into 13 or 14-bits which are then fed into further processing circuitry which includes a storage device, shift register, or comparable equipment, or a counter. The 13 or 14-bit word is then reprocessed down to an 8-bit companded word. The entire process also requires relatively large and complex, hence expensive, transmitters and receivers.

The exponential level elimination companding process does not require unobtainable logic speeds to meet modern transmission system requirements but suffers from the disadvantages that it requires large and complex, hence expensive, transmitters, receivers, and associated circuitry to prevent the exponentially increasing mode of operation from damaging or destroying the circuitry.

Both the linear and exponential level elimination process found in the prior art require the use of analog circuitry which introduces non-linear errors which are difficult to either compensate for or eliminate. The companding characteristic of these circuits are also relatively inflexible, a disadvantage where a single design is to be used for various applications.

The cost of the prior art encoders, in common with the cost of encoders in general, is burdensome in transmission systems where the lines are not synchronous. Since the lines are not synchronous, the coder cannot be shared without the use of gating, timing, and buffering equipment which increases the cost of the overall encoder. The alternative of supplying individual coders for each line in the system is equally undesirable from a cost standpoint.

A current practice in the quantization of analog signals for transmission in the telephone system applications is to encode the input signal logarithmically according to either a "mu-law" or "A-law" companding scheme as defined by H. Kaneko in an article entitled, "A Unified Formulation of Segment Companding Law and Synthesis of Codecs and Digital Companders," September 1970, Bell System Technical Journal. Actually, the quantum levels increase exponentially with increasing signal amplitude; however, the encoding characteristic is normally defined according to the inverse companding function and hence is referred to as logarithmic encoding. Logarithmic mu-law or A-law encoding of signals provides reasonably coonstant signal to quantization noise levels over a wide dynamic range of input voice signals. Thus, logarithmic encoding is desirable for speech processing.

According to the mu-encoding law, m positive chords (segments) are defined, each consisting of an equivalent number of quantization steps. The step size in chord i, ($S_i$), is always equivalent to twice the step size of the proceeding chord, i.e. $S_i = 2S_{i-1}$. When m positive chords are defined in order to track a given signal, the encoding is denominated as mu = $2^m - 1$ code (as defined by Kaneko). Thus, for example, a digital mu = 255 code implies an encoding scheme that employes eight positive and eight negative chords within which any given analog signal sample will be located. In practice, this would be referred to as a fifteen chord approximation law since the inner positive and inner most negative chords are colinear.

An A-law encoding scheme is precisely the same as a mu-law encoding scheme except that the step size of the inner two positive and inner two negative chords are equal. Hence, with eight positive chords defined, an A-law encoding of the analog inpug would be denominated as a thirteen chord approximation.

It is an object of this invention to provide a method for logarithmic encoding of an analog signal that can be implemented using a minimal amount of analog circuitry in conjunction with inexpensive, reliable, digital components, and particularly a method in which the relatively expensive sampling and hold circuitry used in other known systems is not required.

It is a further object of this invention to provide a PCM encoder which directly converts analog signals into a code exhibiting logarithmic characteristics.

It is still a further object of this invention to provide an encoder which requires relatively low speed logic for performing logarithmic encoding.

SUMMARY OF THE INVENTION

According to the invention, mu or A-law encoding is performed directly in a closed loop. Then n equally spaced steps of each chord are said to define n "bins." In general, the bin size of one segment is logarithmically spaced with respect to the bin size of other segments according to the mu or A-law characteristic. Moreover, the bins on each chord are assigned a bin number 1 through $n$, Thus, given the encoding characteristic chosen, a bin number along with the chord number on which the bin lies, completely defines the location of an analog signal sample. This is to say that a bin number and chord number taken together may comprise the digital code word for an analog signal sample.

Still further, in accordance with the principals of the invention, a reference signal level starts from a predetermined reference and is sequentially incremented by the bin size determined by the chord being transversed. Given a time interval of $x$ seconds and a total number of bins traversed y, every $x$ divided by $y$ units of time will require that the reference signal be incremented by the bin size of the chord being traversed. This incrementing of the reference signal continues until such time as the reference signal "catches" the analog signal which may be a variable analog signal during the time interval X, and the tracking of the caught signal continues until the end of the time interval X. Upon being "caught" the difference in bin numbers between the bin containing the sample and the bin containing the predetermined reference level is the digital value attached to the analog input at that instant.

Since the invention calls for digital logic to be employed in a closed (recursive) loop, the analog-to-digital conversion may be performed directly according to the mu or A-law that is chosen. In other words, the coded sample values may be read directly from a convenient point in the loop, periodically, without further digital processing. More particularly, according to the preferred embodiment of the invention to be set out hereinafter, the contents of a counter, which functions to keep track of the bin number and chord number of the quantized analog signal, is read periodically. The code word extracted from the counter is directly transmitted as the compressed PCM code.

In accordance with the preferred embodiment of the invention, both an analog input signal level and the reference signal level discussed above, are input to a means for comparing the two signal levels. The means for comparing will output one of two signal levels which is indicative of whether or not the reference signal level had exceeded the analog input level.

The output signal level produced by the means for comparing serves two functions. If the output signal level indicates the reference signal level is less than the analog input signal level, a digital counter connected in series with the means for comparing, is incremented. The incrementing of the counter reflects the fact that a step through the chord currently being transversed has been taken. Conversely, if the signal level output indicates the reference signal level is greater than the analog input signal level, the counter is to be decremented, reflecting a "step-down"through the chord being traversed. The output signal is simultaneously used to set the gain of an amplifier to one or two levels. The purpose of this variable gain amplifier will be explained below.

The counter that is in series with the means for comparing will serve to indicate which chord is being traversed and to which step in that chord tracking has progressed. As indicated above, the digital output code may be taken directly from the counter without disturbing loop processing.

According to the invention, digital logic is to be connected to the above mentioned counter for the purpose of converting digital information contained in the counter into one of a plurality of signals which will drive a standard digital-to-analog converter. The signal produced by the digital logic determines the voltage level of a signal to be first produced by the digital-to-analog converter and eventually summed with the prior reference signal level.

The digital-to-analog converter output passes through the gain amplifier mentioned above. Apriori, the gain control on the amplifier is set to plus 1 or minus 1 depending upon the output from the means for comparing. Whenever the output signal from the means for comparing indicates that the reference signal level is less than the analog input signal level, the amplifier gain is set to plus 1. Otherwise the amplifier gain is set to minus 1. The reason for setting the gain to plus 1 when the reference signal level is less than the analog input signal level is that incrementing of the reference signal level is performed by summing the amplified signal with the prior reference signal level. Thus the positive gain of the amplifier will cause the prior reference signal level to be increased. Conversely, when the amplifier gain is set to minus 1 the level produced by the digital-to-analog converter is to be used to reduce the reference signal level and thus needs to be affected by the negative gain prior to summing with the prior reference signal level.

Finally, the amplified digital-to-analog converter output signal is summed with the prior reference signal level to produce a new reference signal level. This summing may be performed by a conventional integrator.

The new reference signal level is then input into the means for comparing, and thus in a recursive fashion, closes the tracking loop.

In summary, the disclosure presents apparatus for continuously tracking and digitally encoding a variable analog input signal in a manner that features, (1) the use of digital components in a closed, recursive type, loop arrangement capable of performing mu and A-law encoding directly at minimal operating speeds and which further features (2) the ability to perform mu and A-law encoding in a highly reliable and economical manner to the extent that the cost of individual encoders for each line of a transmission system (per line usage) becomes attractive.

BRIEF DESCRIPTION OF THE DRAWINGS

These and other features of the present invention will be more readily apparent from the following detailed description taken in conjunction with the accompanying drawings.

DETAILED DESCRIPTION

In order to more fully understand the principles of the invention, an illustrative embodiment will be presented which comprises a 7-bit mu = 255 encoder. Although it will be obvious to those skilled in the art how the 7-bit encoder may be modified to accommodate any mu or A-law encoding scheme, the details of the modification required for such encoding will also be set out hereinafter.

Prior to proceeding with the description of the 7-bit encoder, two non-limiting assumptions will be made. First, it will be assumed that eight steps (bins) per chord are to be defined. As pointed out above, the number of steps per chord may be varied but is to be fixed herein for illustrative purposes. Secondly, and again for the sake of illustration, an 8KHz sampling rate is assumed. This is a nominal rate for servicing a standard T-1 telephone channel. It will be readily appreciated by those skilled in the art that the apparatus and method presented herein are suitable with any desired sampling rate and that the choice of the 8KHz rate is only for illustrative purposes.

Figure 1:
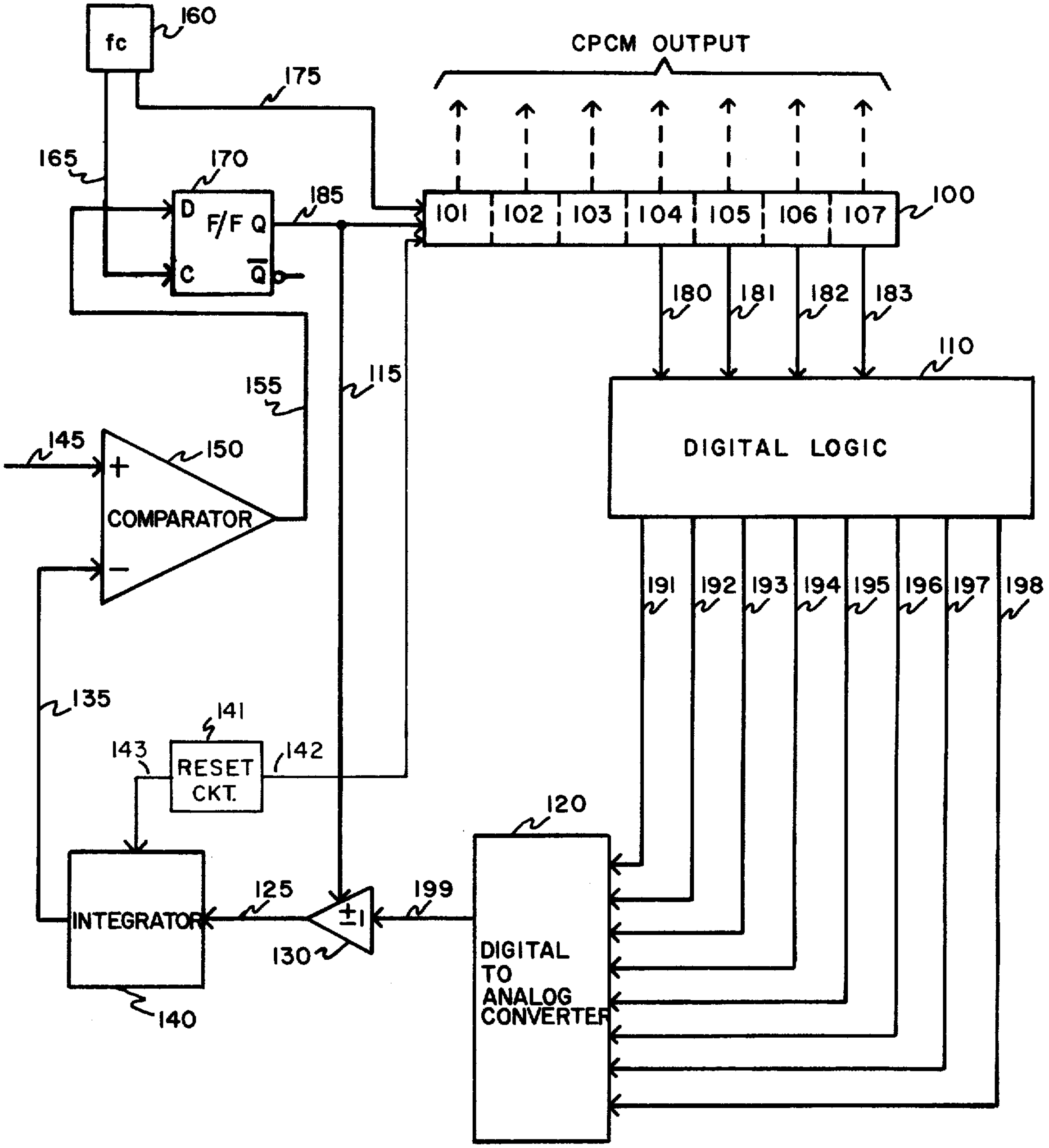
FIG. 1 displays a block diagram of an encoder embodying the principals of this invention.

FIG. 1 depicts in block diagram for a 7-bit mu = 255 encoder. Counter 100 of FIG. 1 is displayed as a 7-bit device. Counter 100, as depicted, has as its least significant bit, bit position 101. The most significant bit position displayed is position 107. The 3-bit field comprised of bit positions 101, 102, and 103 indicates step (bin) numbers within a given chord. The 3-bit field comprised of bit positions 104, 105, and 106 indicate chord numbers. Bit position 107 contains sign information i.e. when the bit is set to 1, positive chord numbers are indicated and when the bit is set to 0, negative chord numbers are indicated. Thus, for example, the counter when set to 1000001 would contain the code word for step 1 of the inner most positive chord. As a further example, the counter when set to 1111110 would be representative of step 1 of the inner most negative chord (the step closest to the origin). Here it is assumed, without limiting the invention, that the outer most negative step is binary step number 0000000 and the outer most positive step is binary step number 1111111.

Recalling that for a mu = 255 encoding scheme there are 16 chords and that 8 steps per chord have been defined for illustrative purposes, there will be a total of 128 bins into which a sample of the analog signal may fall. As indicated above, a reference signal level is first chosen and modified periodically until the analog signal sample is "caught." The reference signal level may be chosen arbitrarily. If, for example, the reference signal level is chosen to be 0 volts, 64 bins would lie above and 64 would lie below the reference. Thus in accordance with this illustrative example, the encoder must be capable of tracking the analog input signal through 64 bins every 125 microseconds. This is so because the assumed sampling rate is 8 KHz and since, it is to be further assumed that the encoder is reset to the reference signal level at the start of each 125 microsecond interval. The last assumption is again for the sake of illustration only, for it will be set out in detail hereinafter, how the apparatus may function without resetting.

In summary, the encoder being set out as the illustrative embodiment herein, must be capable of making a comparison approximately every two microseconds. Thus, the 7-bit mu = 255 encoder being described would operate at a clock rate of 512 KHz.

The 512 KHz operating rate of the encoder when compared with an approximate operating rate of 16 MHz that would be required to perform linear encoding with the same small signal resolution clearly indicates the operating speed advantage gained by direct logarithmic encoding according to the method described herein.

The encooder as shown in FIG. 1 basically comprises a clock 160 which in the described embodiment provides output signals over lines 165 and 175 approximately every two microseconds to a flip-flop 170 and a counter 100 respectively. Analog signals input to the encoder are fed over line 145 to a first input terminal (+) on comparator 150, and a reference signal which is initially of a predetermined value is fed to a second input terminal (minus) on comparator 150. The output of comparator 150 is connected to input D of flip-flop 170. The signal output of flip-flop 170 is connected over line 185 to counter 100 and over conductor 115 to a first input on amplifier 130.

The chord bit positions 104–106 and sign bit position 107 of counter 100 are connected via conductors 180–183 to digital logic 110 which converts the bit information thus input from counter 100 into a signal which indicates one of the eight positive or eight negative chords which is being traversed. The output of the digital logic 110 is connected over conductors 191–198 to the input of D/A converter 120 which provides a representative analog signal over line 199 to a second input of amplifier 130, which analog signal corresponds to the size of the bins within the chord being traversed. As will be shown, amplifier 130 amplifies the analog signal on lead 199 by a factor of +1 or −1 in accordance with the signal on conductor 115 which is in turn determined by the relative value of the reference signal 145 and the analog signal 135.

The output of amplifier 130 is connected over line 125 to integrator 140 which has its output connected over line 135 to provide a modified reference signal level to the second terminal (minus) of comparator 150.

Encoding according to this invention begins by initializing both counter 100 and integrator 140 as follows: Counter 100 and integrator 140 are set to a code word and reference level respectively, indicative of the reference level chosen. Assume, without limiting the scope of the invention, that the reference level chosen is 0 volts. Counter 100 would then be initially set to 0000001 and integrator 140 would be set to output 0 volts on line 135. The output of integrator 140 constitutes the reference signal level which will be compared subsequently with the analog input signal level being encoded. It is noted again, that the analog input signal may vary over the encoding interval and that no fixed analog signal "sample" is required at the outset of an encoding interval.

After initializing the counter and integrator, the analog input signal on line 145 is compared with the reference signal level on line 135. This comparison function is performed by comparator 150.

Comparator 150 is a standard, off-the-shelf device to the prior art and is typified by the Precision Monolithics mono CMP-01 comparator.

Comparator 150 generates one of two output levels as a function of the signals appearing on lines 135 and 145. If the analog signal level on line 145 is greater than the signal level on line 135, a first signal level, signal level 1, is output by comparator 150 onto line 155. If the analog signal level on line 145 is less than the signal level on line 135, a second signal level, signal level 2, is output by comparator 150 onto line 155.

The output of comparator 150 (signal level 1 or signal level 2) will be input to flip-flop 170 and clocked out onto line 185 only at discrete intervals as determined by clock pulses generated by clock 160. Thus, for the current example, flip-flop 170 gates the signal level on line 155 to line 185 once every two microseconds since, as indicated above, clock 160 is a 2 microsecond clock in the illustrative embodiment of the invention.

Flip-flop 170 is commercially available as a 7474 flip-flop. Counter 100 is commercially available as a 7491 counter.

Whenever signal level 1 is gated via flip-flop 170 to line 185, two responses are initiated. First, counter 100 is incremented by one unit. Since the least significant bit of counter 100 is a bit position 101, a step field bit, the counter is incremented in response to signal level 1 by at most one step every two microseconds (for the example being set out herein). Clock 160, connected to counter 100 by line 175, insures that the counter is operated only once every clock interval.

The second response to a signal level 1 appearing on line 185, and consequently on line 115, is the setting of the gain on amplifier 130 to plus 1. Amplifier 130 and its function in the circuit will be described below.

Whenever signal level 2 is gated by flip-flop 170 to line 185 two responses are initiated. First, counter 100 is decremented by one unit and secondly the gain on amplifier 130 is set to minus 1. Again the function of amplifier 130 in the circuit set out herein will be described below.

Assume, for the sake of illustration, that the analog input signal level on line 145 is initially greater than the reference signal level on line 135, counter 100 will be incremented during the first interation through the loop depicted in FIG. 1. In order to change the reference signal level generated by integrator 140, the following is to be performed by the apparatus displayed in FIG. 1.

Each clock interval passing will require that the reference signal level be modified by the step size of the chord being traversed. The information as to step size is extracted by the apparatus depicted in FIG. 1 as follows: Bit positions 104, 105, and 106 of counter 100, as indicated above, constitute a chord number. In other words, an indication of the chord number being traversed is contained in these bits. Thus, for example, if bits 104, 105, 106 were set to 1, 1, 0 respectively, it would be indicative of the fact that chord 3 is being traversed. Recall that the bits of decreasing significance appear on the left side of the counter as displayed in FIG. 1. Recall also that bit 107 will indicate whether negative or positive chord 3 is being traversed. Supposing bit 107 is set to a 1, then positive chord 3 is being traversed. Since encoding is being performed according to mu = 255 code in the current example, the step size in chord 3 is defined as four times the step size in the the innermost positive chord.

Bits 104, 105, 106 and 107 are supplied on lines 180, 181, 182 and 183 respectively, to digital logic 110. The function of digital logic 110 is to convert the 3-bit chord number and the sign bit contained in counter 100 into an indication of which of the 8 positive or 8 negative chords is in fact being traversed. Recall that each of the 8 positive chords (and their symetric negative chord images) has a unique step size. Thus, a signal passed to digital-to-analog converter 120 indicative of the absolute value of the chord number in counter 100 will be sufficient to indicate to converter 120 the size of the signal to be generated corresponding to the step size of the chord being traversed. The above described extraction of data from the counter along with the conversion of this data into signals used to control converter 120 is performed by digital logic 110 as follows.

Figure 2:
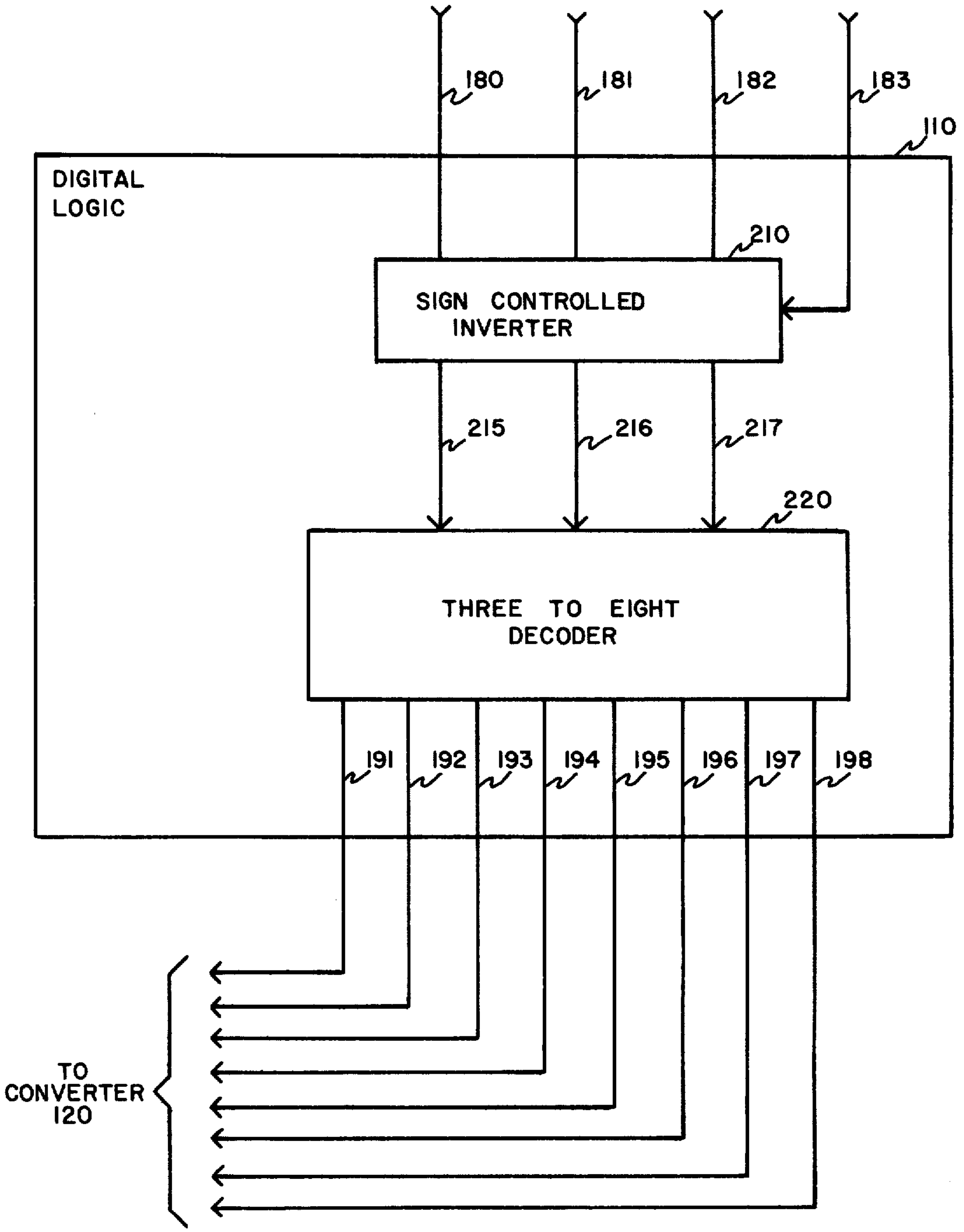
FIG. 2 displays the details of the digital logic portion of FIG. 1.

Reference to FIG. 2 should now be made in conjunction with FIG. 1. FIG. 2 displays digital logic 110 in detail.

Bits 104, 105, and 106 are input to digital logic 110 via lines 180, 181, and 182. Lines 180, 181, and 182 are input to sign controlled inverter 210. Inverter 210 will invert the signals appearing on lines 180, 181, and 182 only when bit position 107 contains a 0. The value, 1 or 0, of bit position 107 is input to converter 210 on line 183. Inverter 210 is a standard, digital component, typified by a 74H87 inverter.

After passing through inverter 210, the values appearing on lines 215, 216, and 217 represent the number (1 through 8 in the illustrative example) corresponding to the chord being traversed.

Lines 215, 216, and 217 connect inverter 210 to a 3 line to 8 line decoder shown in FIG. 2 as unit 220. Decoder 220 takes a 3-bit input representation of a binary number and energizes one of eight output lines based on the binary value of the three input bits. The 74155 is a device belonging to the prior art suitable for use in accord with this invention as a 3 to 8 line decoder.

The output of decoder 220 is, as stated above, an input signal to digital-to-analog converter 120 indicating which of eight possible step sizes is to be produced during the corresponding two microsecond clock interval. As will be indicated below, the level produced will eventually be summed with the prior reference signal level to produce a logarithmic reference signal level. Referring to FIG. 1, line 191 being energized corresponds to an address which causes converter 120 to produce a signal whose amplitude corresponds to the step size of the innermost chord. Line 192 being energized causes a signal whose amplitude is twice the step size of the innermost chord to be generated by converter 120. etc.

The output of converter 120, which, as indicated above, is one of eight sizes corresponding to the eight step sizes of the present example, is input via line 199 to amplifier 130.

As indicated above, the gain on amplifier 130 is set to plus 1 or minus 1 depending on whether counter 100 is to be incremented or decremented. Amplifier 130 may be realized by the model A901 sign bit amplifier available from Hybrid Systems Corporation. If counter 100 is to be incremented, the gain on amplifier 130 must be set to plus "1" so that the amplifier output will, via integrator 140, increase the reference signal level. Similarly, if counter 100 is to be decremented, the gain on amplifier 130 must be set to minus 1 so that the amplifier will, again via integrator 140, decrease the reference signal level. The amplifier output of converter 120 is supplied to integrator 140 on line 125.

Finally, the modified reference signal output by integrator 140, is input to comparator 150 on line 135 closing the loop in a recursive fashion. The analog input signal level appears on line 145 at this time (i.e., the level may have varied since the outset of the encoding interval), and the new reference signal level on line 135 are then compared starting the next iteration of finding and tracking the analog input signal.

It should be noted that according to the illustrative example of the encoding operation set out herein, the counter is modified every 2 microseconds and that the digital information contained in counter 100 may be read out in parallel fashion over the illustrated CPCM output leads once eveery 125 microseconds (immediately prior to reset) to service, for example, an 8 KHz T-1 channel.

According to the example, after 125 microseconds passes, counter 100 and integrator 140 will be reset by reset circuit 141 to initiate encoding during the next 125 microsecond interval. Reset circuit 141 is depicted in FIG. 1 as being interconnected to counter 100 by line 142 and is shown interconnected to integrator 140 by line 143. The reintialization process comprises resetting counter 100 to the code word indicative of the predetermined reference signal and resetting integrator 140 to output the predetermined reference signal. This reinitialization procedure may be eliminated by sufficiently increasing the clock speed. This would result in a continuous tracking operation.

What has been particularly disclosed via the illustrative example constitutes both a novel method of encoding the novel apparatus for encoding an analog input signal level according to a mu = 255 encoding law. As indicated above, the number of steps per chord may be varied to increase the resolution capability of the encoder. For example if 16 steps per chord were required, counter 100 would simply become an 8-bit counter, with a 4-bit field reserved for step number.

The invention is similarly not limited to a 15 chord (8 positive chord) mu-law approximation. If, for example, a 31 cord mu-law approximation were desired, the number of chord bits would be increased to 4 and the digital logic would be required to be modified only so that a 4-bit field instead of a 3-bit field, could be converted to a 1 of 16 versus 1 of 8 output code. The digital-to-analog converter would have to be capable of producing 16 different signal levels instead of only 8 signal levels.

Thus, the invention described herein may perform encoding for an arbitrary *n* step, *m* chord mu encoding law.

To perform A-law encoding with the apparatus depicted in FIG. 1, the encoder must be modified so that 2 of the 8 outputs of logic 110 cause a signal level to be generated by converter 120. These two outputs correspond to steps generated by the two innermost chords (positive or negative) and as stated above the A-law requires the step size of these chords be identical. Thus converter 120 generates a signal corresponding to the step size on the innermost chord whenever the chord bits of counter 100 represent any of the two innermost positive or negataive chords. A representation of any other chord in the counter would cause the step to be modified logarithmically in accordance with the A-law.

The modifications required to the circuit depicted in FIG. 1 to perform such encoding are believed to be obvious. For example, to perform 13 chord A-law encoding, line 192 of FIG. 1 could always be inhibited when energized and line 191 could be instead become energized. Line 193 being energized could always become inhibited when energized and line 192 to become energized beyond the inhibition point, etc. Thus, without modifying the converter, the signal level sizes for performing A-law encoding could be generated.

The modifications to the counter, digital logic, etc., to perform A-law encoding for *n* steps and *m* chords, parallels the modifications set out above for performing *n* step and *m* chord mu-law encoding and are believed to be obvious.

In summary, then, the encoder described performs logarithmic encoding according to either a mu- or A-law directly, and may be utilized on a per line basis featuring a minimal operating speed.

It should be noted that the invention described herein has been illustrated with reference to a particular embodiment. It is to be understood that many details used to facilitate the description of such a particular embodiment are chosen for convenience only and are not limitations on the scope of the invention. Many other embodiments may be devised by those skilled in the art without departing from the scope of the invention. Accordingly, this invention is intended to be limited only by the scope and spirit of the appended claims.

What is claimed is:

1. In an apparatus for continuously tracking and digitally encoding a variable analog input signal according to a logarithmic encoding scheme in which a plurality of chords, each having a plurality of steps is defined, input means over which said analog input signal is received, reference means for providing a predetermined reference signal, comparator means connected to said input means and said reference means for providing output signals indicating the difference in the relative value of said reference signal and said variable analog input signal, second means including a reversible counter means responsive to said output signals to selectively advance and decrease to provide a set of code signals which represent the step number, the chord number, and at least the sign of the chord number, signal processing means including a chord identifier circuit and a digital to analog converter operative to provide feedback signals of different values in response to the receipt of said code signals which represent different ones of said chord numbers and said output signal, the amplitude of which varies for different chords, each step in a chord having the same fixed amplitude, and means in said reference means for summing the signals output from said signal processing means with said predetermined cumulative reference signal to thereby continuously provide a modified reference signal to said first means to allow for continuous tracking and digital encoding of said variable analog input signal according to a logarithmic encoding scheme, and output means for deriving encoded digital signals from said reversible counter means at periodic intervals.

2. An apparatus as set forth in claim 1 in which said comparator means includes control means for gating the signal output of said comparator means to said reversible counter means at periodic intervals.

3. An apparatus as set forth in claim 1 in which the signal output from said comparator means controls said counter means to find and track the level of the analog signal and to provide a binary count which represents the same.

4. An apparatus as set forth in claim 3 in which said counter has a plurality of bit positions for representing the level of said analog signal including a first set of bit positions assigned to represent the step number; a second set of bit positions assigned to represent the chord number; and a third set assigned to represent at least the sign of the chord, and which includes means for outputting the information in said counter.

5. An apparatus as set forth in claim 1 in which said output signals of said signal processing means vary logarithmically according to the chord being transversed.

6. In an apparatus for continuously tracking and digitally encoding a variable analog input signal according to a logarithmic encoding scheme in which a plurality of chords, each having a plurality of steps is defined; input means over which said variable analog signal is received, reference means for providing a predetermined reference signal, comparator means connected to said input means and said reference means for providing output signals indicating the relative value of said reference signal and said analog signal, reversible counter means incremented and decremented by said output signals at predetermined intervals to provide a set of code signals which represent the step number, the chord number, and at least the sign of the chord number, signal processing means including a decoder circuit and digital to analog converter means operative to provide signals of different values in response to the receipt of the code signals which represent different chord numbers, amplification means for amplifying the different value analog signals output from said signal processing means to provide a feedback signal, the amplitude of which varies for different chords, each step in a chord having the same fixed amplitude, third means for modifying the amplifying factor of said amplification means in accordance with said output signals, and means for summing said feedback signal as modified by said amplification means with said predetermined reference signal to thereby continuously provide a cumulative reference signal to said comparator means to allow for continuous tracking and digital encoding of said variable analog input signal according to a logarithmic encoding scheme, and output means for deriving digital encoded signals from said reversible counter means at predetermined intervals.

7. An apparatus as set forth in claim 6 in which said comparator means provides a first signal in response to input of an analog signal which is greater than said reference signal, and a second signal in response to input of an analog signal which is less than said reference signal, and in which said third means is connected to provide said first and second signals to said amplification means to control same to provide an amplification factor of +1 and −1 respectively.

8. An apparatus as set forth in claim 6 in which which includes means for outputting digital signals which represent an encoding of the step and chord numbers contained in said reversible counter means.

9. An apparatus as set forth in claim 6 in which said counter means has a first set of bit positions assigned to represent the step number, a second set of bit positions assigned to represent the chord number, and a third set of bit positions assigned to represent at least the sign of the chord number, and in which said counter means are incremented by said comparator means whenever the analog signal is greater than said reference signal, and decremented by said comparator means whenever said reference signal is greater than said analog signal.

10. An apparatus as set forth in claim 6 in which said counter means provides m chord bits, and in which said signal processing means includes a sign controlled inverter responsive to said m chord bits and the sign signal provided by said second means to convert a negative chord number into the $m$ bit symmetric positive binary equivalent of said negative number, and an $m$ to $2^m$ decoder connected to said invertei for providing one of $2^m$ output signals in response to the $m$ bit binary input from said inverter.

11. An apparatus as set forth in claim 6 in which said comparator means includes a first input connected to said input means and a second input connected to said reference means, and a flip-flop circuit for gating the different levels output from said comparator circuit to said second means.

12. In an apparatus for continuously tracking and digitally encoding a variable analog input signal according to a logarithmic encoding scheme, input means over which said analog signal is received, reference means for providing a predetermined reference signal, comparator means connected to said input means and said reference means operative to provide a first signal whenever the value of said analog signal exceeds the value of said reference signal, and a second signal whenever said analog signal is less in value than said reference signal, reversible counter means having a plurality of bit positions, control means for selectively gating the output of said comparator means to said counter means, said reversible counter means being incremented in response to said first signal and decremented in response to said second signal, a first set of said bit positions being assigned to register code signals representative of the step number, a second set of said bit positions being assigned to register code signals representative of the chord number, and at least one of said bit positions being assigned to register code signals representative of sign of the chord number, digital processing means for generating different signal outputs for different code signal inputs, means for transmitting the code signals in said reversible counter means which represent the chord number of said digital processing means to said digital processing means, D/A converter connected to said digital processing means for generating analog feedback signals having an amplitude which varies for different chords, each step in a chord having the same fixed amplitude, amplification means controlled by the output of said D/A converter means by a first factor whenever said first signal appears at the output of said control means and to amplify the output of said D/A converter means by a second different factor whenever said second signal appears at the output of said control means, and means connected to said amplification means for summing the amplified signals with said predetermined reference signal to thereby track said input analog signals and to continuously provide a modified reference signal to said comparator means to allow for continuous tracking and digital encoding of said variable analog input signal according to a logarithmic encoding scheme, and output means for deriving digital encoded signals from said reversible counter means at predetermined intervals.

13. In an apparatus for continuously tracking and digitally encoding a variable analog input signal according to a $2^m$ chord, $2^n$ step logarithmic encoding scheme; comparator means for comparing said analog input signal with a predetermined reference signal operative to output a first signal whenever said analog signal exceeds said reference signal, and to output a second signal whenever said analog signal does not exceed said reference signal, an n+m+1 bit reversible counter, the n least significant bits of said reversible counter representing the step number, the next m most significant bits of said reversible counter representing the chord number and the most significant bit of said reversible counter being a sign bit, control means connected to said comparator means for gating the output of said comparator means to said reversible counter, said reversible counter being incremented in response to said first signal and being decremented in response to said second signal, digital processing means connected to said counter operative to receive said m chord number bits from said counter and to energize one of $2^m$ output lines, the energized one of said lines being determined by the binary value of said received bits, analog signal generating means connected to said digital processing means for generating a plurality of analog signal levels, each of said signal levels being associated with and generated in resonse to a predetermined one of said $2^m$ output lines being energized, the amplitude of said signal levels being different for different chords, each step in a chord having the same fixed amplitude, amplification means connected to the output of said control means and to the output of said analog signal generating means for amplifying the output of said signal generating means by a factor of +1 whenever said first signal appears at the output of said control means, and for amplifying the output of said generating means by a factor of −1 whenever said second signal appears at the output of said control means, an integrator connected to said amplification means for summing the amplified signal output therefrom with said predetermined reference signal to thereby continuously provide a modified reference signal for input to said comparator means thus closing the encoding loop, and providing continuous tracking of the input analog signals and a digital encoding thereof according to a logarithmic encoding scheme, and output means for deriving digital encoded signals from said reversible counter at predetermined intervals.

14. An apparatus as set forth in claim 13 which includes reset means for resetting said counter to the code word indicative of the predetermined reference signal and resetting said integrator to output said predetermined reference signal and thereby indicating further finding and tracking of the analog signal.

15. An apparatus as set forth in claim 13, in which said output means includes means for outputting the digital signals in said counter in a parallel pattern, thereby directly extracting from the encoding loop digital signals exhibiting logarithmic encoding characteristics.

16. An apparatus in accordance with claim 13 wherein said control means further comprises a flip-flop for gating said first and second signal levels to said counter, and a clock for periodically enabling both said flip-flop and said counter.

17. An apparatus in accordance with claim 13 in which said counter means provides m chord bits, and in which said digital means further comprises a sign controlled inverter responsive to said m chord bits and the sign signal provided by said counter means to convert a negative chord number into the m bit symmetric positive binary equivalent of said negative number, and an m to $2^m$ decoder connected to said inverter for providing one of $2^m$ output signals in response to the m bit binary number input from said inverter.

18. A method for continuously tracking and digitally encoding a variable analog input signal according to a $2^m$ chord, $2^n$ step, logarithmic encoding scheme, with an apparatus which includes a comparator circuit, a reversible counter, a D/A converter circuit and a summing circuit, comprising the steps of comparing said analog input signal with a predetermined reference signal in a comparator circuit, generating a first signal in said comparator circuit whenever said analog input signal exceeds said reference signal to increment a reversible counter by one step, generating a second signal in said comparator circuit whenever said input signal does not exceed said reference signal to decrement said counter by one step, extracting from said counter the number which corresponds to the chord being traversed, converting said extracted number in a decoder circuit into a unique signal indicative of the chord which is being traversed and generating an analog signal lever with digital to analog means which has an amplitude which varies for different chords, each step in a chord having the same fixed amplitude, modifying the generated analog signal level by different factors for said first and second signals, summing said modified analog signal level with said predetermined reference signal to thereby continuously generate a new reference signal for comparison with said variable analog input signal, and periodically extracting a digitally encoded signal from said reversible counter which represents said analog input signal according to a logarithmic encoding scheme.

19. A method as set forth in claim 18 which includes the further step of reinitiating the finding and tracking operation by providing said predetermined reference signal in unmodified form and resetting the counter.

20. A method as set forth in claim 18 which includes the further step of extracting the chord step and sign information contained in said counter.

21. A method for continuously tracking and digitally encoding a variable analog input signal according to a $2^m$ chord, $2^n$ step, logarithmic encoding scheme, with an apparatus comprising a comparator circuit, a reversible counter, a D/A converter circuit and a summing circuit, comprising the steps of comparing said analog input signal with a predetermined reference signal in a comparator circuit, generating a first signal in said comparator circuit whenever said analog input signal exceeds said reference signal to increment a $2^n$ step, $2^m$ chord reversible digital counter by one step, generating a second signal in said comparator circuit whenever said input signal does not exceed said reference signal to decrement said counter by one step, extracting from said counter the binary number which corresponds to the chord number being traversed, converting said extracted number in a decoder circuit into a unique signal indicative of which of said $2^m$ chords is being traversed, generating with digital to analog means a different analog signal level for different converted binary numbers, the amplitude of the signal level being different for different chords, each step in a chord having the same fixed amplitude, amplifying the generated analog signal level by a factor of +1 whenever said first signal is input to said counter, and amplifying said generated analog signal level by a factor of −1 whenever said second signal is input to said counter, integrating said amplified analog signal level with said predetermined reference signal, thereby continuously generating a new reference for comparison with said variable analog input signal, and periodically extracting a digitally encoded signal from said reversible counter which represents said analog signal according to a logarithmic encoding scheme.

* * * * *

UNITED STATES PATENT AND TRADEMARK OFFICE

CERTIFICATE OF CORRECTION

PATENT NO. : 3,905,028

DATED : September 9, 1975

INVENTOR(S) : Paul A. Wintz, John R. Sergo, Jr., and Ching-Long Song

It is certified that error appears in the above-identified patent and that said Letters Patent are hereby corrected as shown below:

Column 12, line 50, after "converter" insert -- means --;

Column 14, line 3, after "digital" insert -- processing --.

Signed and Sealed this

*thirteenth* Day of *January 1976*

[SEAL]

*Attest:*

RUTH C. MASON
*Attesting Officer*

C. MARSHALL DANN
*Commissioner of Patents and Trademarks*